(12) United States Patent
Mochizuki et al.

(10) Patent No.: US 7,006,354 B2
(45) Date of Patent: Feb. 28, 2006

(54) HEAT RADIATING STRUCTURE FOR ELECTRONIC DEVICE

(75) Inventors: Masataka Mochizuki, Nagareyama (JP); Yasuhiro Iijima, Tokyo (JP)

(73) Assignee: Fujikura Ltd., Tokyo (JP)

( * ) Notice: Subject to any disclaimer, the term of this patent is extended or adjusted under 35 U.S.C. 154(b) by 597 days.

(21) Appl. No.: 10/259,386

(22) Filed: Sep. 30, 2002

(65) Prior Publication Data

US 2003/0081385 A1    May 1, 2003

Related U.S. Application Data

(60) Provisional application No. 60/330,618, filed on Oct. 26, 2001.

(51) Int. Cl.
*H05K 7/20* (2006.01)

(52) U.S. Cl. ............... 361/705; 361/712; 361/717; 165/185; 257/706; 428/620

(58) Field of Classification Search ............ 228/180.1, 228/180.22; 165/80.3, 185; 174/16.3; 257/705, 257/706, 707, 713, 717; 428/209, 901, 354, 428/610, 614, 620; 361/704, 705, 706–712, 361/717–719, 722
See application file for complete search history.

(56) References Cited

U.S. PATENT DOCUMENTS

| | | | | |
|---|---|---|---|---|
| 5,132,776 A | * | 7/1992 | Hanada et al. | 257/729 |
| 5,981,085 A | * | 11/1999 | Ninomiya et al. | 428/614 |
| 6,037,066 A | * | 3/2000 | Kuwabara | 428/610 |
| 6,432,497 B1 | * | 8/2002 | Bunyan | 428/40.1 |

* cited by examiner

*Primary Examiner*—Anatoly Vortman
(74) *Attorney, Agent, or Firm*—Oblon, Spivak, McClelland, Maier & Neustadt, P.C.

(57) ABSTRACT

A heat radiating structure for an electronic device, for cooling an electronic part by transferring the heat generated in the electronic part to a heat spreader has a grading layer, which is located between the electronic part and the heat spreader and having a coefficient of thermal expansion varied such that it is substantially equal or approximate at its portion on the electronic part side to the coefficient of thermal expansion of the electronic part and such that it is substantially equal or approximate at its portion on the heat spreader side to the coefficient of thermal expansion of the heat spreader.

8 Claims, 3 Drawing Sheets

HEAT RADIATING STRUCTURE FOR ELECTRONIC DEVICE

This application claims priority from Provisional Application Ser. No. 60/330,618, filed Oct. 26, 2001, pending, incorporated herein by reference.

BACKGROUND OF THE INVENTION

1. Field of the Invention

The present invention relates to a heat radiating structure for cooling an electronic device such as a processor, e.g., an MPU or an image processor by releasing the heat from the electronic device.

2. Background of the Invention

An electronic device such as a processor (MPU) or an image processor has an increasing degree of integration and operating frequency. Accordingly, an electronic device of this kind generates more heat.

As the electronic device is heated to a higher temperature, it may malfunction or break. It is, therefore, necessary to dissipate heat more efficiently from the electronic device. In the prior art, for example, a heat sink is used as a means for cooling the electronic device.

When heat is to be dissipated through a heat sink, it is necessary to transfer heat from the electronic device to the heat sink. For the most efficient heat transfer the electronic device and the heat sink may closely contact each other. However, an electronic device such as an MPU is constructed to have a circuit in a die of silicon and to emphasize electric characteristics. It is, therefore, difficult for a heat sink for heat radiation to make direct contact with the electronic device.

In the prior art there has been developed a heat sink structure, in which a heat spreader is arranged in close contact with the surface of the electronic device to be contacted by the heat sink. One example of this heat sink structure is schematically shown in FIG. 7. A heat spreader 1, as shown, is made of an anodized metal of aluminum or copper. This heat spreader 1 is constructed to have a flat plate portion 2 to be closely contacted by the electronic device, and a protrusion 3 protruding from the flat plate portion 2. The heat spreader 1 is fixed by fitting the protrusion 3 in a pedestal portion 4 such as a lead frame or substrate.

The heat spreader 1 is fixed on the pedestal portion 4 together with a die 5 including an integrated circuit and is contacted by the surface of the die 5 through a grease or jelly 6 having a high thermal conductivity. Moreover, the heat spreader 1 is made of a material having excellent thermal conductivity such as copper so that it can substantially increase the heat transfer area of the die 5 without damaging the die 5 or its circuit. Thus, the characteristics of heat radiation of the electronic device can be improved by fixing a heat sink 7 in close contact with the heat spreader 1.

In order to improve heat dissipation by using the heat spreader 1, it is preferred to make heat resistance between the die 5 and the heat spreader 1 as low as possible. Therefore, the grease or jelly 6 having high thermal conductivity of the prior art which fills the clearance between the die 5 and the heat spreader 1 is preferably replaced by a join which is made directly between the die 5 and the heat spreader 1 by means of soft solder.

However, the electronic part such as the die 5 is made of a material (e.g., silicon) emphasizing electric characteristics, whereas the heat spreader 1 is made of a material (e.g., copper) emphasizing thermal characteristics, so they have very different coefficients of thermal expansion or linear expansion.

When the temperature of the electronic device rises, therefore, thermal stress may occur between the electronic part such as the die 5 and the heat spreader 1 to cause a separation. In other words, their adhesion may be broken by the thermal stress. As a result, heat resistance between the die 5 and the heat spreader 1 may rise high enough to make it impossible to cool sufficiently the electronic part such as the die 5.

SUMMARY OF THE INVENTION

A main object of the invention is to lower heat resistance between an electronic part and a heat spreader.

Another object of the invention is to provide a heat radiating structure which can keep the join between the electronic part and the heat spreader stable during temperature change and thereby improve heat dissipation from the electronic part.

Still another object of the invention is to provide a heat radiating structure for an electronic device, which uses a heat spreader having excellent thermal conductivity.

Still another object of the invention is to provide a heat radiating structure which uses a heat spreader to be contacted directly by an electronic part to improve heat radiation from the electronic part.

In the heat radiating structure of the invention there is sandwiched between an electronic part and a heat spreader a grading layer which has different coefficients of thermal expansion between the electronic part side and the heat spreader side. Therefore, the difference in the coefficient of thermal expansion at the contacting portion between the electronic part and the grading layer and the difference in the coefficient of thermal expansion at the contacting portion between the heat spreader and the grading layer are both reduced. As a result, high temperature does not produce high thermal stress to disengage the electronic part and the grading layer or disengage the heat spreader and the grading layer. In other words, heat resistance between the electronic part and the heat spreader does not rise and heat radiation from the electronic part can be maintained in an excellent state.

In the heat radiating structure of the invention the heat spreader is made of a material having a small coefficient of thermal expansion such as aluminum nitride or invar. Therefore, the difference in the coefficient of thermal expansion between the electronic part and the heat spreader is reduced so that heat stress between the electronic part and the heat spreader can be suppressed to a small value, even if the electronic part undergoes a temperature rise. As a result, contact between the electronic part and the heat spreader can maintained to cool the electronic part sufficiently.

In the heat radiating structure of the invention the heat spreader is provided with a chamber therein to act as a heat pipe. With this structure dissipation of heat in the heat spreader is caused not only by heat conduction, but also by heat transport in the form of the latent heat of a working fluid, so that heat resistance in the heat spreader is reduced. Therefore, heat radiation from the electronic part can be improved to cool the electronic part efficiently.

In the heat radiating structure of the invention the heat spreader can be held in direct contact with the electronic part by making the heat spreader of aluminum and burying a lubricant member in the face to make contact with the electronic part. With this construction, no intermediate substance is present between the electronic part and the heat spreader and heat resistance therebetween can be lowered. Moreover, the coefficient of thermal expansion of the face making contact with the electronic part is reduced, so that thermal stress can be kept small even when the electronic part undergoes a temperature rise. As a result, no separation occurs between the electronic part and the heat spreader and heat resistance therebetween can be prevented from increasing.

The objects and features of the invention will more fully discussed in the following detailed description with reference to the accompanying drawings. It is to be expressly understood, however, that the drawings are for the purpose of illustration only and are not intended as a definition of the limits to the invention.

DESCRIPTION OF THE PREFERRED EMBODIMENTS

Figure 1:
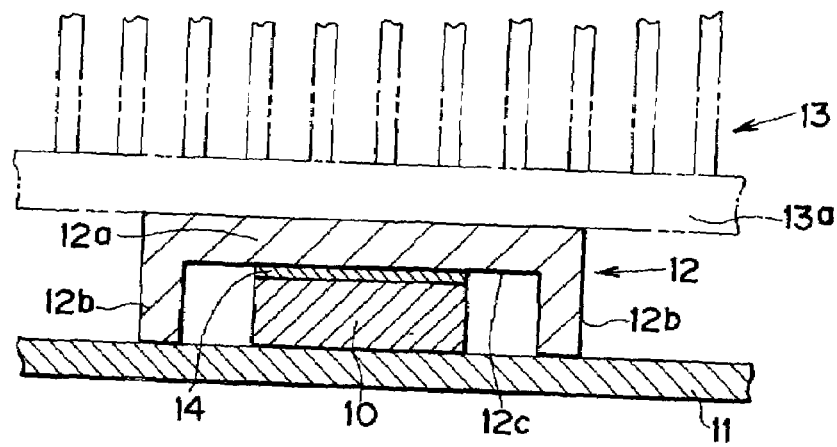
FIG. 1 is a sectional view showing one embodiment of the invention schematically.

As shown in FIG. 1, a die 10 or an electronic part having a fine circuit is fixed on a pedestal portion 11 such as a substrate or socket. This die 10 has a structure similar to that known in the prior art and is a rectangular member having a thickness of several millimeters and a circuit formed on a silicon chip.

Across the die 10 there is arranged a heat spreader 12. The heat spreader 12 is made of a material having a high thermal conductivity such as copper or aluminum for aiding in the transmission of heat from the die 10 to a heat sink 13. As shown in FIG. 1, the heat spreader 12 is provided with a rectangular flat plate portion 12a confronting the upper face of the die 10 and leg portions 12b formed on the two right and left end portions or at the four corners of the flat plate portion 12a. The heat spreader 12 is fixed on the pedestal portion 11 by leg portions 12b.

Leg portions 12b are of such a height to be substantially equal to the thickness of the die 10 so that the lower face or back face 12c of the flat plate portion 12a and the die 10 may closely contact each other. Between the flat plate portion 12a and the die 10, moreover, there is located a grading layer 14.

Figure 2:
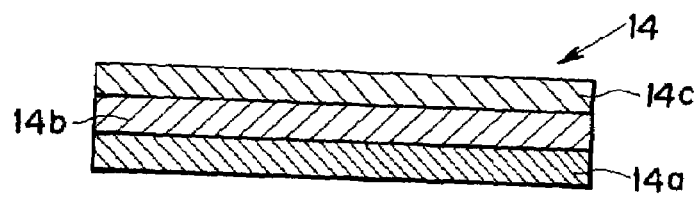
FIG. 2 is a schematic sectional view of the structure of a grading layer used in a heat radiating structure of FIG. 1.

Grading layer 14 is constructed to have different coefficients of thermal expansion between the upper face side and the lower face side. As schematically shown in FIG. 2, for example: a first layer 14a on the lower side to make contact with the die 10 has a coefficient of thermal expansion approximate to that of the die 10; an intermediate second layer 14b has a coefficient of thermal expansion intermediate between that of the die 10 and that of the heat spreader 12; and a third layer 14c on the upper face side has a coefficient of thermal expansion approximate to that of the heat spreader 12. This multi-layered structure can be formed either by laminating sheets of different materials or by changing the compositions of a composite material of a plurality of materials in its thickness direction.

Heat sink 13 having a suitable structure is closely mounted on the upper face, as shown in FIG. 1, of the heat spreader 12, which is joined to the die 10 through the grading layer 14. As shown in FIG. 1, the flat plate portion 12a of the heat spreader 12 has an area larger than that of the front face of the die, and the base portion 13a of the heat sink 13 has an area larger than that of the flat plate portion 12a. Thus, the die 10, the grading layer 14 and the heat spreader 12 can be joined to each other with a soft solder or solder or with an adhesive of a synthetic resin or the like. Alternatively, the grading layer 14 and the heat spreader 12 can also be joined to each other by a diffused junction method, in which interatomic diffusion is caused in the boundary between the grading layer 14 and the heat spreader 12 by pressurizing them.

In the heat radiation or sink structure thus far described, heat generated when the die 10 acts, is transferred through the grading layer 14 to the heat spreader 12. As a result, the temperature of the heat spreader 12 rises, and heat is further transferred to the heat sink 13 and is dissipated from the heat sink 13 to the ambient air. Thus, the heat of the die 10 is dissipated to the atmosphere so that the temperature rise of the die 10 is suppressed. In other words, the die 10 is cooled.

In this case, the heat spreader 12 is heated together with the die 10 so that it expands thermally according to the temperature. Therefore, the thermal expansion of the die 10 is exceeded by that of the heat spreader 12. However, the first layer 14a of the grading layer 14 which is directly contacted by the die 10 has a coefficient of thermal expansion substantially equal to that of the die 10 so that no serious thermal stress occurs between them. On the other hand, the third layer 14c of the grading layer 14, which is directly contacted by the heat spreader 12 having a higher coefficient of thermal expansion, has a coefficient of thermal expansion substantially equal to that of the heat spreader 12 so that no serious thermal stress occurs between them. Thus, the thermal stresses are small between the two members contacting each other. Therefore, those two members do not disengage to establish any clearance therebetween and to raise the heat resistance.

In the construction as shown in FIG. 1, the heat transfer path from the die 10 to the heat spreader 12 is prevented from having a clearance or an air layer to obstruct the heat transfer so that heat resistance can be kept at a small value. As a result, it is possible to provide a heat sink structure in which heat dissipation from the die 10 is excellent.

Figure 3:
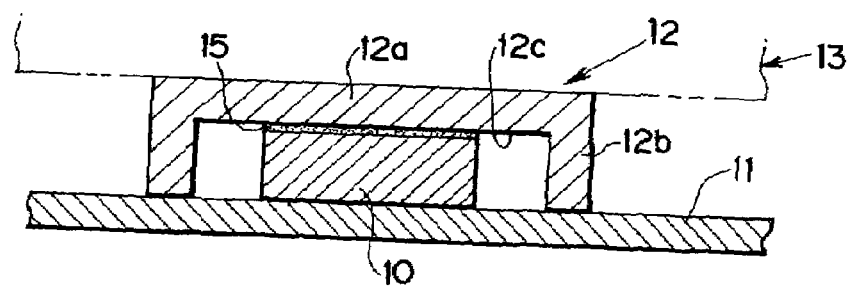
FIG. 3 is a sectional view showing another embodiment of the invention schematically.

Another embodiment of the invention will be described here. In FIG. 3, the heat spreader 12 arranged across the die 10 is made of a material having a coefficient of thermal expansion approximate to that of silicon constituting the die 10. Specifically, the heat spreader 12 is made of aluminum nitride. Alternatively, this material may be made of nickel steel, i.e., invar containing 0.4% of Mn, 0.2% of C, 36% of Ni, and the remainder being Fe.

Moreover, the heat spreader 12 and the die 10 are joined to each other by graphite 15 located therebetween. For example, the die 10 and the heat spreader 12 are integrally joined to each other by locating graphite 15 between the upper face of the die 10 and the lower face of the flat plate portion 12a of the heat spreader 12 and by applying a predetermined heat to it while pressurizing it. A diffused junction method can adopted for joining the heat spreader 12 and graphite 15.

In the construction shown in FIG. 3, as in the foregoing embodiment, heat generated by the action of the die 10, is transferred through the heat spreader 12 to the heat sink 13. Heat is then dissipated to the atmosphere so that the die 10 is efficiently cooled. Specifically, the die 10 and the heat spreader 12 are joined to each other such that heat resistance therebetween can be reduced to improve heat radiation efficiency.

When heat generated by the die 10 raises the temperature, no large difference occurs between the coefficients of thermal expansion of the die 10 and the heat spreader 12 because the coefficients are approximate to each other. Specifically, no significant thermal stress is caused between the die 10 and the heat spreader 12 so that their join is satisfactory to keep heat resistance at a low value.

Figure 4:
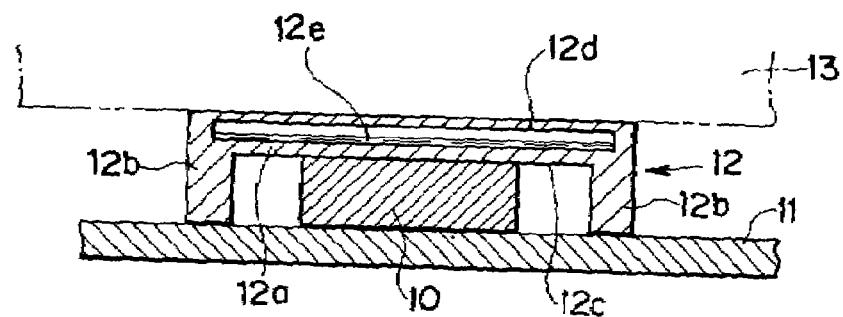
FIG. 4 is a sectional view showing a further embodiment of the invention schematically.

In an embodiment shown in FIG. 4, the thermal conductivity of the heat spreader 12 is raised to make the entire heat resistance lower. Specifically, the heat spreader 12 shown in FIG. 4 has a hollow structure in its flat plate portion 12*a*. The hollow portion 12*d* can be constructed by attaching a cover member to a body portion having a recess. Moreover, this hollow portion 12*d* is prepared by evacuating an incondensable gas such as air from inside and by encapsulating a condensable fluid such as water as a working fluid 12*e* therein. In other words, the heat spreader 12 is formed into a heat pipe having a so-called "vapor chamber".

Here, the join between the heat spreader 12 and the die 10 may be made either by the aforementioned structures or by a structure known in the prior art.

In the structure shown in FIG. 4, heat generated by the die 10 is transferred to the heat spreader 12 in contact with the die 10. The working fluid 12*e* in the vapor chamber is evaporated by that heat, and the resultant vapor flows to the portion of lower temperature and pressure, i.e., the upper face side making contact with the heat sink 13. At this point, the vapor of the working fluid 12*e* releases its heat and condenses. Then, the heat thus released from working fluid 12*c* is transferred from the upper face side of the heat spreader 12 to the heat sink 13 and dissipated further from the heat sink 13 to the ambient air. Thus, the heat of the die 10 is dissipated to the air and the die 10 is cooled.

In the heat spreader 12, as described above, the working fluid 12*e* encapsulated in the vapor chamber transports the heat as its latent heat. The calories dissipated are far more than that due to the heat conduction so that the heat resistance of the heat spreader 12 is substantially lowered. As a result, the heat resistance from the die 10 to the heat sink 13 can be reduced to cool the die 10 efficiently.

The metal suitable for the heat spreader 12 has a larger coefficient of thermal expansion than that of the silicon making the die 10, as described above, because metal such as copper or aluminum has a high heat conductivity. If the die 10 and the heat spreader 12 are smoothed in their relative movements while being in close contact with each other for heat transfer, it is possible to suppress or prevent the occurrence of thermal stress between the die 10 and the heat spreader 12, as exemplified in FIGS. 5 and 6. The heat spreader 12, as shown, is made of aluminum, and the back face 12*c* (or the lower face of FIGS. 5 and 6) of the flat plate portion 12*a* is anodized to form cracks 16. These cracks 16 are filled with a soft lubricating material such as molybdenum sulfide 17, which is partially exposed to the outside. Treated metal of this kind is known as "Fujimite" (Registered Trade Mark).

Figure 5:
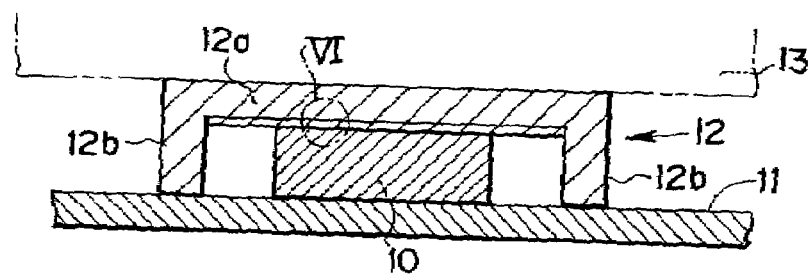
FIG. 5 is a sectional view showing a further embodiment of the invention schematically.
Figure 6:
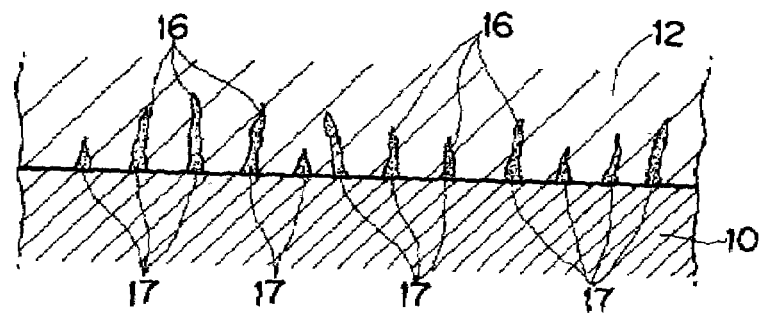
FIG. 6 is a schematic view showing a portion VI of FIG. 5 in an enlarged scale.
Figure 7:
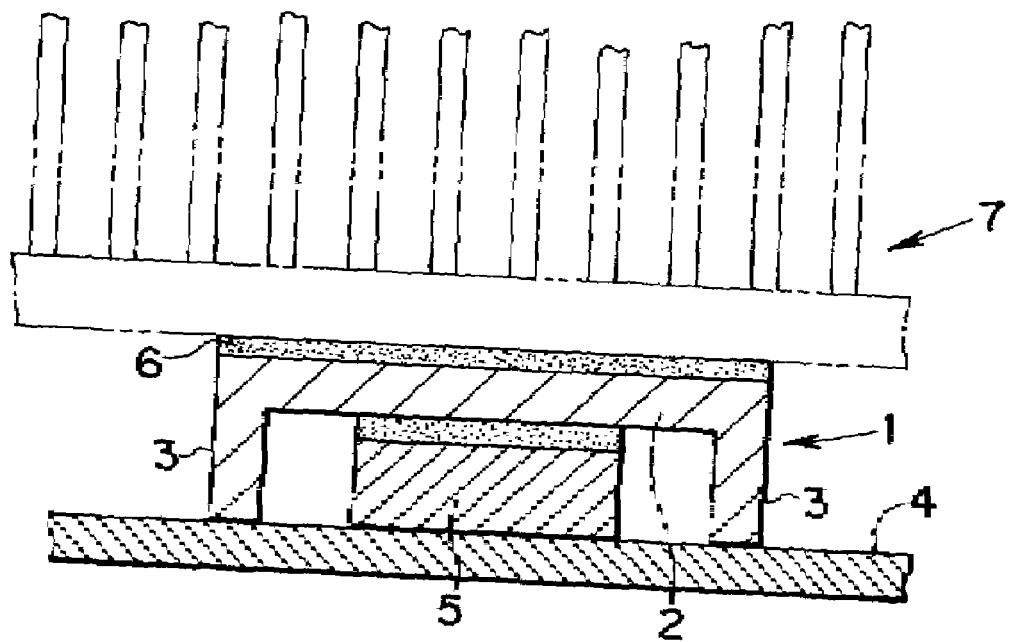
FIG. 7 is a sectional view showing an example of the prior art schematically.

In the construction shown in FIGS. 5 and 6, therefore, adhesion between the die 10 and the heat spreader 12 is improved to lower heat resistance therebetween. Even if the difference between the coefficients of thermal expansion of the die 10 and the heat spreader 12 is so large that the thermal expansions become different when the die 10 generates heat to raise the temperature, the die 10 and the heat spreader 12 will smoothly slide relative to each other and establish no thermal stress therebetween. With the construction shown in FIGS. 5 and 6 it is possible to improve heat radiation from the die 10, i.e., improve the cooling performance of the die 10.

What is claimed is:

1. An electronic device comprising:
   a die or an electronic part,
   a heat radiating structure and
   a heat spreader;
   wherein
   said heat radiating structure comprises a grading layer located between and in contact with said die or electronic part and said heat spreader,
   wherein said grading layer comprises at least three separate layers,
   wherein the layer of the grading layer in contact with said die or electronic part has a coefficient of thermal expansion equal to or approximate to that of the die or electronic part, and
   wherein the layer of the grading layer in contact with said heat spreader has a coefficient of thermal expansion equal to or approximate to that of said heat spreader.

2. The electronic device according to claim 1,
   wherein said die or electronic part, said heat radiating structure and said heat spreader are joined with an adhesive or a solder.

3. The electronic device according to claim 1,
   wherein said heat spreader and said grading layer are joined by a diffused junction.

4. A heat radiating structure for cooling an electronic device comprising:
   a grading layer has two opposing faces and comprises at least three separate layers,
   wherein the coefficient of thermal expansion of the face of the layer next to an electronic part is substantially equal to that of the electronic part, and
   wherein the face of the layer next to the heat spreader is substantially equal to that of the heat spreader.

5. The electronic device according to claim 1, wherein said grading layer comprises laminated sheets.

6. The heat radiating structure according to claim 4, wherein said grading layer comprises laminated sheets.

7. The electronic device according to claim 1, wherein said at least three layers in said grading layer each comprise a composite material, which comprises a plurality of materials.

8. The heat radiating structure of claim 4, wherein said at least three layers in said grading layer each comprises a composite material, which comprises a plurality of materials.

* * * * *